(12) United States Patent
Wang et al.

(10) Patent No.: US 9,871,047 B1
(45) Date of Patent: Jan. 16, 2018

(54) MEMORY STRUCTURE AND A METHOD FOR FORMING THE SAME

(71) Applicant: UNITED MICROELECTRONICS CORP., Hsinchu (TW)

(72) Inventors: Yu-Lin Wang, Taipei (TW); Wei-Chi Lee, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/410,933

(22) Filed: Jan. 20, 2017

(51) Int. Cl.
*H01L 27/11* (2006.01)
*H01L 29/78* (2006.01)
*H01L 21/8234* (2006.01)

(52) U.S. Cl.
CPC .. *H01L 27/1104* (2013.01); *H01L 21/823431* (2013.01); *H01L 21/823437* (2013.01); *H01L 29/785* (2013.01)

(58) Field of Classification Search
CPC ......... H01L 27/1104; H01L 21/823437; H01L 29/785; H01L 21/823431
See application file for complete search history.

(56) References Cited

U.S. PATENT DOCUMENTS

| | | | | |
|---|---|---|---|---|
| 6,970,373 | B2* | 11/2005 | Datta | G11C 11/412 257/E21.661 |
| 7,512,017 | B2* | 3/2009 | Chang | H01L 21/845 257/E21.442 |
| 7,808,051 | B2* | 10/2010 | Hou | H01L 27/11807 257/368 |
| 9,012,287 | B2* | 4/2015 | Liaw | H01L 27/1104 438/283 |
| 9,276,088 | B1* | 3/2016 | Singh | H01L 29/66795 |
| 9,305,633 | B2* | 4/2016 | Grover | G11C 11/412 |
| 9,385,195 | B1* | 7/2016 | Zhang | H01L 29/1033 |
| 2003/0102518 | A1* | 6/2003 | Fried | H01L 21/84 257/401 |
| 2015/0214340 | A1* | 7/2015 | Maeda | H01L 29/66818 438/283 |
| 2016/0043092 | A1* | 2/2016 | Mojumder | G11C 11/412 257/369 |
| 2016/0190239 | A1* | 6/2016 | Suk | H01L 29/0649 257/351 |

* cited by examiner

Primary Examiner — William Coleman
(74) Attorney, Agent, or Firm — WPAT, PC

(57) ABSTRACT

A semiconductor structure includes a SRAM cell having transistors defined by fins and metal gate stack structures. A transistor and a corresponding pick up cell are disposed in an extension direction of the fins. The transistor and the corresponding pick up cell have metal gate stack structures of the same type.

16 Claims, 4 Drawing Sheets

MEMORY STRUCTURE AND A METHOD FOR FORMING THE SAME

TECHNICAL FIELD

The disclosure relates to a memory structure and a method for forming the same, and particularly to a memory structure having a rearranged pick up region and a method for forming the same.

BACKGROUND

Memory devices have been widely used in electronic systems for data storage. They can be divided into two categories: volatile memory device and non-volatile memory device. A volatile memory device requires power to maintain the stored information. In contrast, a non-volatile memory device retains its information even when the power is turned off. Like other types of semiconductor devices, as the sizes become smaller, difficulties on manufacture may emerge. For example, in the manufacture of a static random-access memory (SRAM) of the 14 nm node or an even smaller node, the loss at the edge of a memory array region due to the boundary effect of the mask may be a critical problem.

SUMMARY

In this disclosure, a memory structure beneficial for the manufacture and a method for forming the same are provided.

According to some embodiments, the semiconductor structure comprises a SRAM cell. The SRAM cell comprises transistors defined by fins and metal gate stack structures. One of the transistors and a corresponding pick up cell are disposed in an extension direction of the fins, and the one of the transistors and the corresponding pick up cell have gate structures of a same type.

According to some embodiments, the method comprises forming fins and metal gate stack structures defining transistors of a SRAM cell. The fins and the metal gate stack structures are formed such that one of the transistors and a corresponding pick up cell are disposed in an extension direction of the fins, and the one of the transistors and the corresponding pick up cell have metal gate stack structures of a same type.

Figure 1:
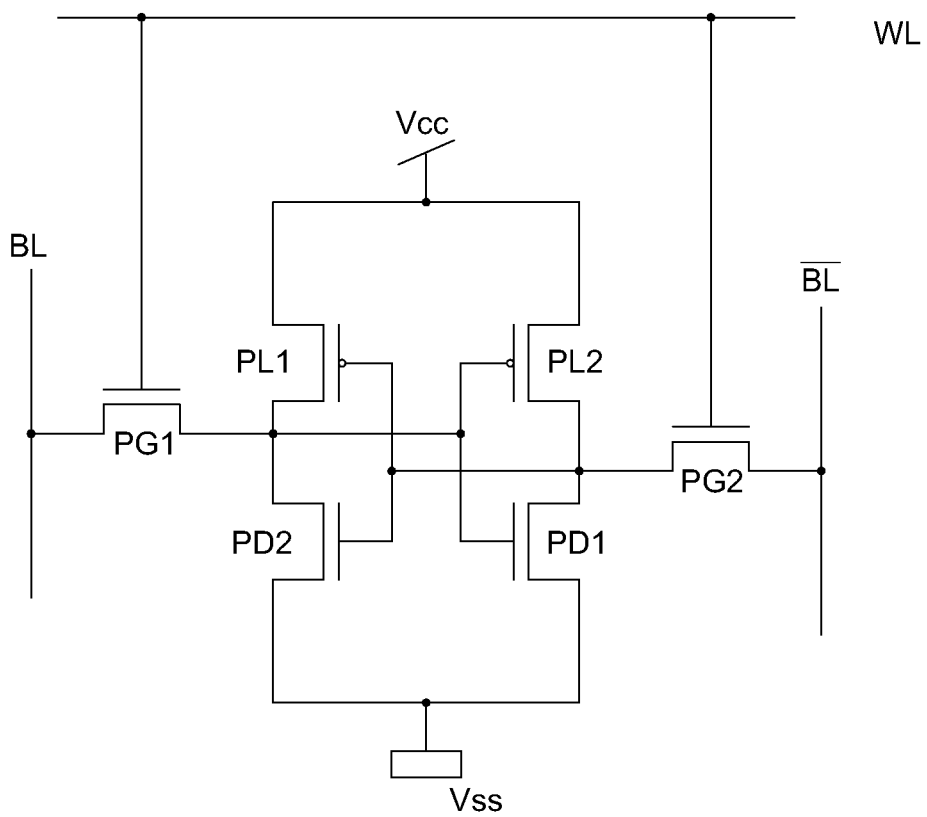
FIG. 1 shows an exemplary circuit of a SRAM.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings. It is appreciated that elements and features of one embodiment may be beneficially incorporated in another embodiment without further recitation. For ease of illustration, a memory structure according to embodiments is shown to have an arrangement for a SRAM. According to the embodiments, the semiconductor structure comprises a SRAM cell. The SRAM cell includes transistors defined by fins and metal gate stack structures. One of the transistors and a corresponding pick up cell are disposed in an extension direction of the fins, and the one of the transistors and the corresponding pick up cell have gate structures of a same type.

A SRAM cell may consist of six transistors, of which a circuit is shown in FIG. 1. The six transistors may be two pull-up transistors PL1 and PL2, two pull-down transistors PD1 and PD2, as well as two pass-gate transistors PG1 and PG2. The pull-up transistors PL1 and PL2 may be PMOS transistors and known as PMOS load transistors. The pull-down transistors PD1 and PD2 and the pass-gate transistors PG1 and PG2 may be NMOS transistors. The pass-gate transistors PG1 and PG2 may be coupled to bit lines BL and a word line WL. However, the memory structure according to the embodiments is not limited thereto. For example, a SRAM cell may consist of four, eight, ten, or other number of transistors.

Figure 2A:
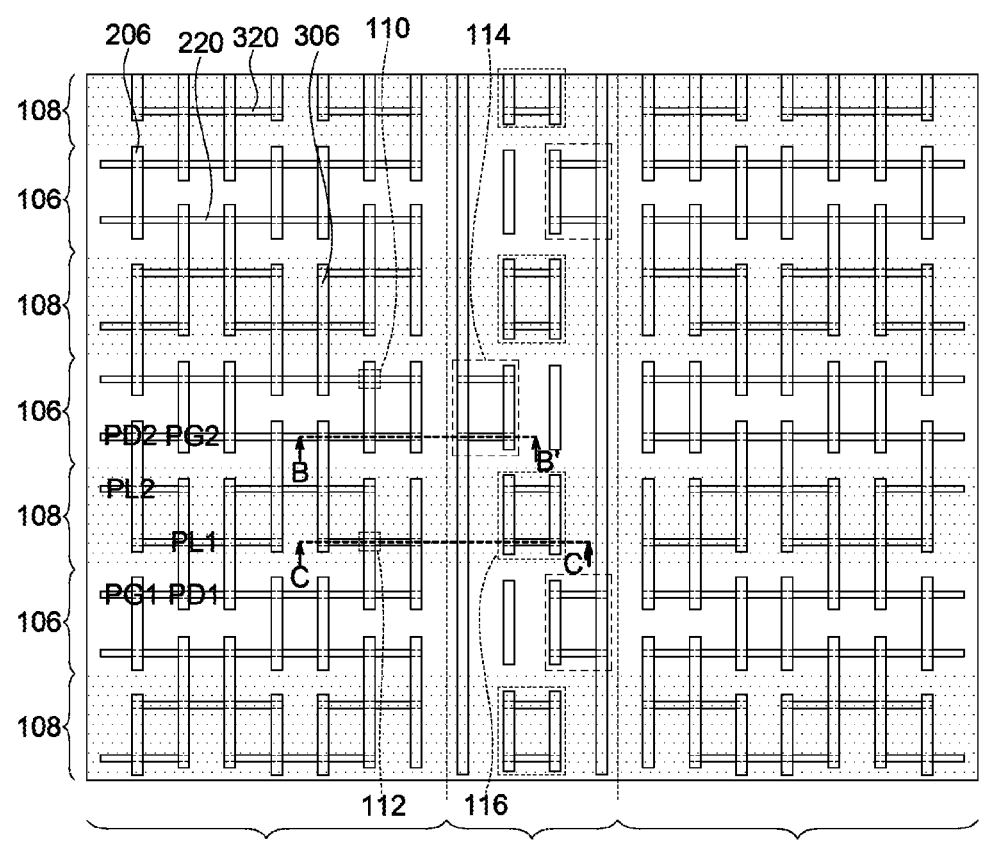
FIGS. 2A-2C show details of a memory structure according to embodiments.
Figure 2B:
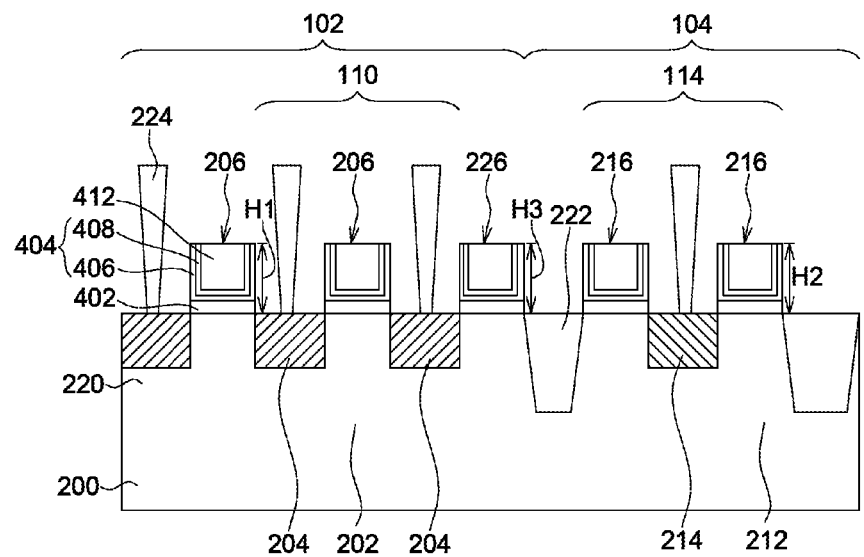
Figure 2C:
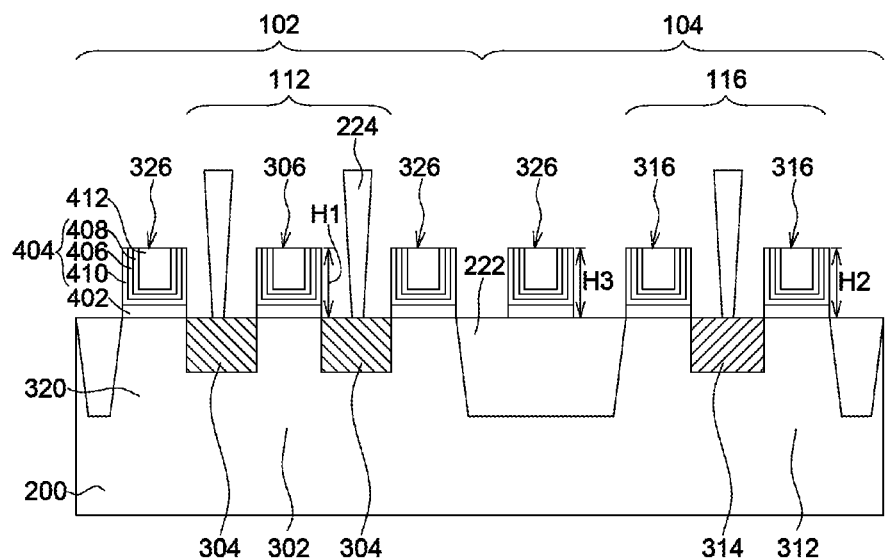

Details of the structural configuration of the memory structure having a SRAM cell consisting of six transistors are shown in FIGS. 2A-2C, wherein FIG. 2A shows a top view, and FIGS. 2B and 2C show cross-sectional views along lines B-B' and C-C', respectively. It is to be noted that some elements may be omitted from the figures, and the elements in the figures may not reflect their real sizes and configurations.

Referring to FIG. 2A, the memory structure may comprise a memory array region 102 and a pick up region 104. The pick up region 104 is disposed adjacent to the memory array region 102. Alternatively, the memory structure may comprise one or more memory array regions 102 and one or more pick up regions 104 disposed alternately.

The memory array region 102 comprises a plurality of transistors 110 and 112. The transistors 110 and 112 are defined by fins 220 and 320 as well as metal gate stack structures 206 and 306. The transistors 110 and 112 build up a plurality of SRAM cells. For example, the transistors 110 may be NMOS transistors, and the transistors 112 may be PMOS transistors. As such, four transistors 110 functioned as PD1, PD2, PG1 and PG2 and two transistors 112 functioned as PL1 and PL2 may build up a SRAM cell.

The pick up region 104 comprises a plurality of pick up cells 114 and 116. According to some embodiments, a pick up cell 114 correspond to the transistors 110 disposed in the same rows 106, and a pick up cell 116 correspond to the transistors 112 disposed in the same rows 108. The pick up cells 114 and 116 and the corresponding transistors 110 and 112 are disposed in an extension direction of the fins 220 and 320. The pick up cells 114 and 116 are configured for providing voltages, such as Vcc, Vss or the like, to the corresponding transistors 110 and 112.

According to the embodiments, a transistor and a corresponding pick up cell, which is configured for providing voltages to the transistor, have metal gate stack structures of the same type. For example, in a row 106 along an extending direction of the fin 220, all the metal gate stack structures of the NMOS transistors 110 and the corresponding pick up cell 114 are n-type metal gate stack structures. Similarly, in a row 108 along an extending direction of the fin 320, all the metal gate stack structures of the PMOS transistors 112 and the corresponding pick up cell 116 are p-type metal gate stack structures.

Now referring to FIG. 2B, cross-sectional details of a transistor 110 and a corresponding pick up cell 114 disposed in the row 106 are shown. As shown in FIG. 2B, the transistor 110 may comprise a first well 202, two first heavily doped regions 204 and a first metal gate stack structure 206. The two first heavily doped regions 204 are disposed in the first well 202 and separated from each other. The first metal gate stack structure 206 is disposed on the first well 202 between the two first heavily doped regions 204. The pick up cell 114 may comprise a second well 212, a second heavily doped region 214 and two second metal gate stack structures 216. The second well 212 is coupled to the first well 202. For example, both the first well 202 and the second well 212 may extend from the fins 220 to the substrate 200, connect with each other and form a common well. The second heavily doped region 214 is disposed in the second well 212. The two second metal gate stack structures 216 are disposed on the second well 212. The second heavily doped region 214 is disposed between the two second metal gate stack structures 216.

The first well 202, the second well 212 and the second heavily doped region 214 have a first conductive type, and the two first heavily doped regions 204 have a second conductive type different from the first conductive type. The first metal gate stack structure 206 and the two second metal gate stack structures 216 are of a same type. In the row 106, the first conductive type is p-type, the second conductive type is n-type, and the first metal gate stack structure 206 and the two second metal gate stack structures 216 are n-type metal gate stack structures. In particular, the first metal gate stack structure 206 and the two second metal gate stack structures 216 may be n-type standard threshold voltage metal gate stack structures.

As shown in FIG. 2B, a n-type standard threshold voltage metal gate stack structure may comprise a high-k dielectric layer 402, work function multi-layers 404 including a first layer 406 and a second layer 408, and a metal gate electrode 412. The high-k dielectric layer 402 may be formed of HfO and have a thickness of 18 Å. The first layer 406 of the work function multi-layers 404 may be formed of TiN and have a thickness of 17 Å. The second layer 408 of the work function multi-layers 404 may be formed of TiAlC and have a thickness of 50 Å. The metal gate electrode 412 may be formed of W. In some embodiments, the n-type standard threshold voltage metal gate stack structure may further comprise at least any one of a buffer layer (not shown), a bottom barrier layer (not shown), and a top barrier layer (not shown). The buffer layer may be disposed between the high-k dielectric layer 402 and the work function multi-layers 404. The buffer layer may be formed of $SiO_2$ and have a thickness of 7 Å. The bottom barrier layer may be disposed between the high-k dielectric layer 402 and the work function multi-layers 404, in particular between the buffer layer and the work function multi-layers 404. The bottom barrier layer may be formed of TaN and have a thickness of 13 Å, or may be formed of TiN and have a thickness of 10 Å. The top barrier layer may be disposed between the work function multi-layers 404 and the metal gate electrode 412. The top barrier layer may be formed of TiN and have a thickness of 20 Å.

According to some embodiments, isolation structures 222 such as shallow trench isolation (STI) structures may be provided between the fins 220. Contacts 224 may be provided on the heavily doped regions 204 and 214. Further, for ease of manufacture, some third gate structures 226 that are the same type as the first and second gate structures 206 and 216 may be provided at the positions on or near the STI structures, such as the STI structure separating the fin 220 of the memory array region 102 from the fin 220 of the pick up region 104. According to some embodiments, a height H1 of the first gate structure 206, a height H2 of the second gate structure 216, and even a height H3 of the third gate structure 226, are substantially the same. Here, the term "substantially" means that some processing deviation is acceptable.

Referring to FIG. 2C, cross-sectional details of a transistor 112 and a corresponding pick up cell 116 disposed in the row 108 are shown. The arrangement in the row 108 is similar to that in the row 106. In particular, the configuration of the transistor 112 is similar to configuration of the transistor 110, and the configuration of the pick up cell 116 is similar to configuration of the pick up cell 114. However, in the row 108, the first well 302, the second well 312 and the second heavily doped region 314 have a first conductive type being n-type, and the two first heavily doped regions 304 have a second conductive type being p-type. Further, the first and second metal gate stack structures 306 and 316, as well as the third metal gate stack structures 326, are p-type metal gate stack structures. In particular, they may be p-type standard threshold voltage metal gate stack structures. A p-type standard threshold voltage metal gate stack structures may be similar to a n-type standard threshold voltage metal gate stack structure, but further comprise a third layer 410 of the work function multi-layers 404. The third layer 410 of the work function multi-layers 404 may be formed of TiN and have a thickness of 10 Å.

A method for forming the memory structure according to embodiments comprises forming fins and metal gate stack structures defining transistors of a SRAM cell. The fins and the metal gate stack structures are formed such that one of the transistors and a corresponding pick up cell are disposed in an extension direction of the fins, and the one of the transistors and the corresponding pick up cell have metal gate stack structures of a same type.

Figure 3:
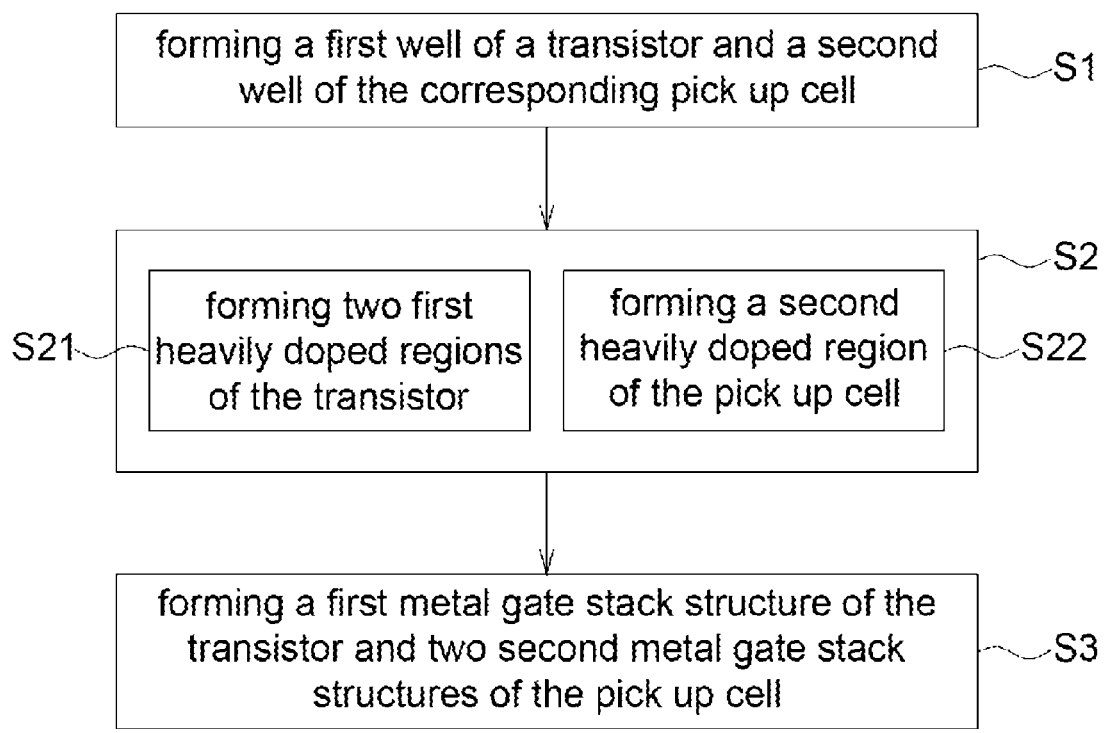
FIG. 3 shows an exemplary step sequence for forming elements of a memory structure according to embodiments.

For ease of manufacture, a transistor and the corresponding pick up cell may be formed simultaneously, as shown in FIG. 3. In step S1, a first well of the transistor and a second well of the pick up cell are formed. The first well and the second well are coupled to each other. The first well and the second well have a first conductive type. In step S2, heavily doped regions of the transistor and the pick up cell are formed. Step S2 comprises steps S21 and S22 for the heavily doped regions of the transistor and the pick up cell, respectively. In step S21, two first heavily doped regions of the transistor are formed in the first well. The two first heavily doped regions are separated from each other. The two first heavily doped regions have a second conductive type different from the first conductive type. In step S22, a second heavily doped region of the corresponding pick up cell is formed in the second well. The second heavily doped region has the first conductive type. In step S3, a first metal gate stack structure of the transistor and two second metal gate stack structures of the pick up cell are formed. The first metal gate stack structure is formed on the first well between the two first heavily doped regions. The two second metal gate stack structures are formed on the second well such that the second heavily doped region is disposed between the two second metal gate stack structures. The first metal gate stack structure and the two second metal gate stack structures are of the same type. In particular, they may have the same structural features such as the same height since they are formed in the same step.

More typically, corresponding elements are simultaneously formed in all desired positions of the whole areas of the memory array region 102 and the pick up region 104. For example, all of the fins, either in the memory array region 102 or the pick up region 104, may be formed by the same process. In addition, all of the n-type and p-type metal gate stack structures in the memory array region 102 and the pick up region 104 may be formed by a replacement metal gate process. It is appreciated that the step sequence can be adjusted as needed if possible.

According to the embodiments, the same-type metal gate stack structures are disposed across the memory array and pick up regions. Due to such arrangement, even though metal gate stack structures are formed for FinFET structures, the transistors near an edge of a memory array region will not be destroyed by the boundary effect of a mask used in the replacement metal gate process as in a typical memory structure. The memory structure according to the embodiments is particularly suitable for the 14 nm node or an even smaller node.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory structure, comprising:
  a SRAM cell including transistors defined by fins and metal gate stack structures;
  a pick up cell including transistors defined by fins and metal gate stack structures;
  wherein one of the transistors of the SRAM cell and a corresponding transistor of the pick up cell are disposed in an extension direction of the fins, and the one of the transistors of the SRAM cell and the corresponding transistor of the pick up cell have the same metal gate stack structures.

2. The memory structure according to claim 1, wherein the corresponding transistor of the pick up cell is configured for providing a well voltage to the one of the transistors of the SRAM cell.

3. The memory structure according to claim 1,
  wherein the one of the transistors of the SRAM cell comprises:
    a first well;
    two first heavily doped regions disposed in the first well and separated from each other; and
    a first metal gate stack structure disposed on the first well between the two first heavily doped regions;
  wherein the corresponding transistor of the pick up cell comprises:
    a second well coupled to the first well;
    a second heavily doped region disposed in the second well; and
    two second metal gate stack structures disposed on the second well, wherein the second heavily doped region is disposed between the two second metal gate stack structures;
  wherein the first well of the SRAM cell, the second well of the pick up cell and the second heavily doped region of the pick up cell have a first conductive type, and the two first heavily doped regions of the SRAM cell have a second conductive type complementary to the first conductive type; and
  wherein the first metal gate stack structure of the SRAM cell and the two second metal gate stack structures of the pick up cell have the same metal gate stack structures.

4. The memory structure according to claim 3, wherein the first conductive type is p-type, the second conductive type is n-type, and the first metal gate stack structure and the two second metal gate stack structures are n-type metal gate stack structures.

5. The memory structure according to claim 3, wherein the first conductive type is n-type, the second conductive type is p-type, and the first metal gate stack structure and the two second metal gate stack structures are p-type metal gate stack structures.

6. The memory structure according to claim 3, wherein a height of the first metal gate stack structure and a height of the two second metal gate stack structures are substantially the same.

7. The memory structure according to claim 4, wherein the first metal gate stack structure and the two second metal gate stack structures are n-type standard threshold voltage metal gate stack structures.

8. The memory structure according to claim 5, wherein the first metal gate stack structure and the two second metal gate stack structures are p-type standard threshold voltage metal gate stack structures.

9. A method for forming a memory structure, comprising:
  forming fins and metal gate stack structures defining transistors of a SRAM cell and transistors of a pick up cell;
  wherein the fins and the metal gate stack structures are formed such that one of the transistors of the SRAM cell and a corresponding transistor of the pick up cell are disposed in an extension direction of the fins, and the one of the transistors of the SRAM cell and the corresponding transistor of the pick up cell have the same metal gate stack structures.

10. The method according to claim 9, wherein the corresponding transistor of the pick up cell is configured for providing a well voltage to the one of the transistors of the SRAM cell.

11. The method according to claim 9, comprising:
  forming a first well of the one of the transistors of the SRAM cell and a second well of the corresponding transistor of the pick up cell, wherein the first well of the SRAM cell and the second well of the pick up cell are coupled to each other and have a first conductive type;
  forming two first heavily doped regions of the one of the transistors of the SRAM cell in the first well of the SRAM cell, wherein the two first heavily doped regions of the SRAM cell are separated from each other and have a second conductive type complementary to the first conductive type;
  forming a second heavily doped region of the corresponding transistor of the pick up cell in the second well of the pick up cell, wherein the second heavily doped region of the pick up cell has the first conductive type; and
  forming a first metal gate stack structure of the one of the transistors of the SRAM cell on the first well of the SRAM cell between the two first heavily doped regions of the SRAM cell, and forming two second metal gate stack structures of the corresponding transistor of the pick up cell on the second well of the pick up cell such that the second heavily doped region of the pick up cell is disposed between the two second metal gate stack structures of the pick up cell, wherein the first metal gate stack structure of the SRAM cell and the two second metal gate stack structures of the pick up cell have the same metal gate stack structures.

12. The method according to claim 11, wherein the first conductive type is p-type, the second conductive type is n-type, and the first metal gate stack structure and the two second metal gate stack structures are n-type metal gate stack structures.

13. The method according to claim 11, wherein the first conductive type is n-type, the second conductive type is p-type, and the first metal gate stack structure and the two second metal gate stack structures are p-type metal gate stack structures.

14. The method according to claim 11, wherein a height of the first metal gate stack structure and a height of the two second metal gate stack structures are substantially the same.

15. The method according to claim 12, wherein the first metal gate stack structure and the two second metal gate stack structures are n-type standard threshold voltage metal gate stack structures.

16. The method according to claim 13, wherein the first metal gate stack structure and the two second metal gate stack structures are p-type standard threshold voltage metal gate stack structures.

* * * * *